(12) United States Patent
Yasuda et al.

(10) Patent No.: US 6,218,060 B1
(45) Date of Patent: Apr. 17, 2001

(54) ELECTRON BEAM EXPOSURE METHOD AND ELECTRON BEAM EXPOSURE APPARATUS

(75) Inventors: Hiroshi Yasuda; Hideaki Komami, both of Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/462,545

(22) PCT Filed: May 11, 1999

(86) PCT No.: PCT/JP99/02431

§ 371 Date: Jan. 10, 2000

§ 102(e) Date: Jan. 10, 2000

(87) PCT Pub. No.: WO99/59183

PCT Pub. Date: Nov. 18, 1999

(30) Foreign Application Priority Data

May 11, 1998 (JP) .................................................. 10-127737

(51) Int. Cl.⁷ ........................................................ G03F 9/00
(52) U.S. Cl. ............................. 430/30; 430/296; 430/942; 250/492.22; 250/492.3
(58) Field of Search ............................. 430/30, 296, 942; 250/492.22, 492.3

(56) References Cited

FOREIGN PATENT DOCUMENTS

| | | |
|---|---|---|
| 57-64932 | 4/1982 | (JP) . |
| 60-262419 | 12/1985 | (JP) . |
| 62-147725 | 7/1987 | (JP) . |
| 07263301 | 10/1995 | (JP) . |
| 08045460 | 2/1996 | (JP) . |
| 8-191042 | 7/1996 | (JP) . |

*Primary Examiner*—Christopher G. Young
(74) *Attorney, Agent, or Firm*—Christie, Parker & Hale, LLP (57) ABSTRACT

The present invention relates to a multicolumn electron-beam lithography system. An object of the present invention is to realize, at low cost, a multicolumn electron-beam lithography system capable of concurrently exposing chips on one wafer. The multicolumn electron-beam lithography system has a plurality of columns (8-1, 8-2, 8-3, 8-4) each includes a main deflector (16), and a sub deflector (14). The main deflector offers a large magnitude of deflection. The sub deflector offers a small magnitude of deflection. The plurality of columns irradiates an electron beam to a sample while deflecting it according to main deflector-related data (62) and sub deflector-related data (61). Herein, the plurality of columns concurrently draws a pattern on one wafer (50). The multicolumn electron-beam lithography system further includes a deviation memory (63) and a correction unit (64). Deviations of the optical axes of the columns measured in advance are stored in the deviation memory. The correction unit corrects the main deflector-related data (62) alone for each column according to the deviation of the optical axis of each column. The columns draw the same pattern concurrently. Consequently, very fine machining can be achieved with a high throughput ensured. In particular, a high degree of integration of circuit elements constituting a semiconductor device can be attained at an appropriate cost.

6 Claims, 8 Drawing Sheets

MAIN DEFLECTOR-RELATED DATA

| X | Y | ADDRESS IN SUB DEFLECTOR-RELATED DATA |
|---|---|---|
| X1 | Y1 | 0,99 |
| X2 | Y2 | 100,199 |
| ⋮ | ⋮ | ---- |
| ⋮ | ⋮ | |
| | | |
| | | |
| | | |
| Xn1 | Yn1 | ADRn1, ADRn1+100 |
| ⋮ | ⋮ | ---- |
| ⋮ | ⋮ | |
| Xn2 | Yn2 | ADRn2, ADRn2+100 |
| ⋮ | ⋮ | ---- |
| | | |

SUB DEFLECTOR-RELATED DATA

| ADR | x | y | DATA |
|---|---|---|---|
| 0 | --- | --- | DAT0 |
| 1 | --- | | ----- |
| 2 | | | |
| 3 | | | |
| ⋮ | | | |
| ⋮ | | | |
| ⋮ | | | |
| n1 | xn1 | yn2 | DATn1 |
| ⋮ | | | |
| ⋮ | | | |
| ⋮ | | | |
| n2 | xn2 | yn2 | DATn2 |
| ⋮ | | | |

ELECTRON BEAM EXPOSURE METHOD AND ELECTRON BEAM EXPOSURE APPARATUS

BACKGROUND ART

The present invention relates to an electron-beam lithography system or, more particularly, to a multicolumn electron-beam lithography system, having a plurality of electron-beam exposure systems, which offers an improved throughput.

Semiconductor integrated circuits now tend to have circuit elements thereof integrated to a higher degree due to advances in microprocessing technologies. The performance of the microprocessing technologies is becoming better. Above all, photolithography technology that is implemented in, for example, a conventional step-and-repeat photolithography system with demagnification, is expected, to reach its limits. Electron-beam lithography technology has the potential to take over from photolithography technology and become the new standard microprocessing technology. Electron-beam lithography technology is drawing attention as a next-generation lithography technology.

TECHNICAL FIELD

Figure 1:
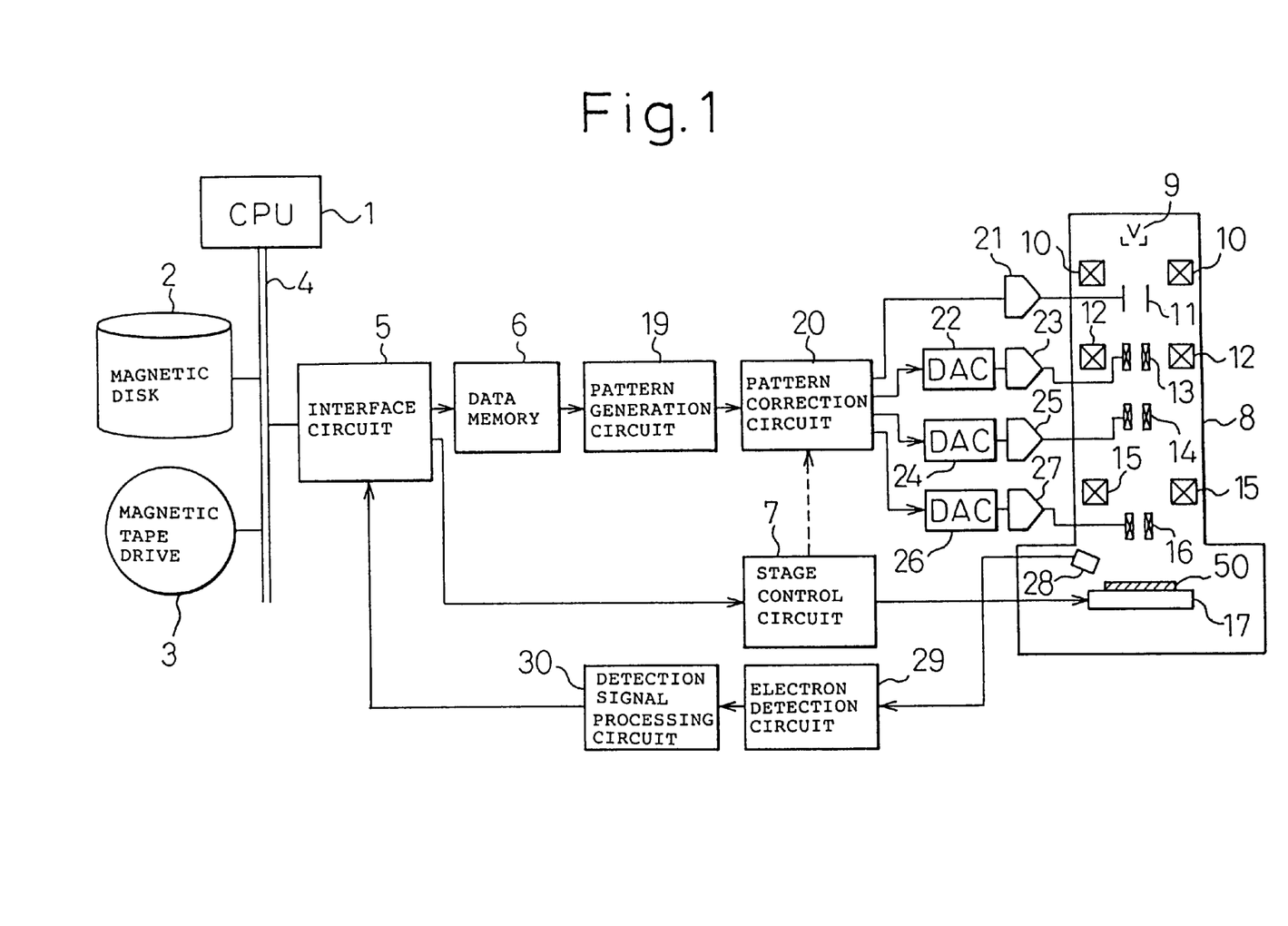
FIG. 1 shows the configuration of an example of conventional electron-beam lithography systems.

FIG. 1 shows the configuration of an electron-beam lithography system. There are shown a processor 1, a magnetic disk 2, and a magnetic tape drive 3. These units are interconnected by a bus 4, and connected to a data memory 6 and a stage control circuit 7 via an interface circuit 5 over the bus 4.

A housing (column) 8 accommodates an electron gun 9, a lens 10, a blanking electrode 11, a lens 12, a feedback coil 13, a sub deflector coil 14, a lens 15, a main deflector coil 16, a stage 17, and a sample 50. The sample 50 is placed on the stage 17. The stage 17 is controlled to be moved in x and Y directions according to an output signal of the stage control circuit 7.

Moreover, data read from the data memory 6 is supplied to a pattern correction circuit 20 via a pattern generation circuit 19. The pattern correction circuit 20 applies a blanking signal to the blanking electrode 11 via an amplifier 21. Moreover, the pattern correction circuit 20 applies a signal to the coils 13, 14, and 16 via D/A converters (DAC) 22, 24, and 26 and amplifiers 23, 25, and 27.

An electron beam radiated from the electron gun 9 is passed through the lens 10, and transmitted or intercepted by the blanking electrode 11. The electron beam is reshaped into a rectangular beam of parallel rays permitting a spot of 3 $\mu$m or less in diameter. The beam is then deflected by the feedback coil 13, sub deflector coil 14, and main deflector coil 16. The beam is then passed through a projection lens 15 and converged on the surface of the sample. The areas over which the feedback coil 13, sub deflector coil 14, and main deflector coil 16 can deflect light get larger in that order. For ensuring a larger area in which light can be deflected, the number of windings of a coil must be increased. Response times required by the feedback coil 13, sub deflector coil 14, and main deflector coil 16 get longer in that order. That is to say, the settlement wait time required by the feedback coil 13 is the shortest. The settlement wait times required by the sub deflector coil 14 and main deflector 16 get longer in that order.

The above description is applied to a lithography method using a rectangular beam for exposure. There are various other methods including a block lithography method and a blanking aperture array lithography method. The basic configuration adaptable to the methods is identical to that shown in FIG. 1.

Figure 2:
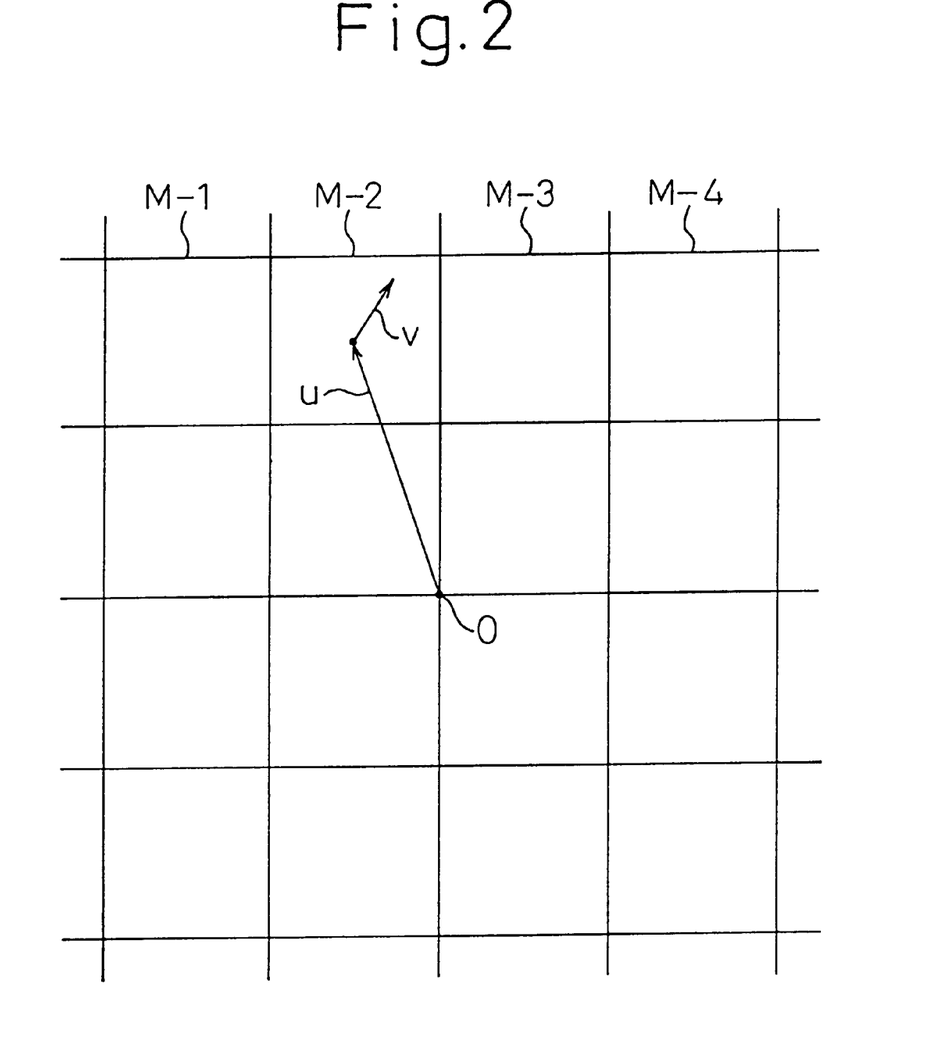
FIG. 2 is an explanatory diagram concerning a procedure of dividing one chip into a plurality of areas and exposing each area using a main deflector and sub deflector in combination.

FIG. 2 is an explanatory diagram concerning deflections achieved for exposure by a main deflector and sub deflector. As shown in FIG. 2, an exposure pattern to be drawn on one chip during exposure is divided into a plurality of portions M-1, M-2, etc. each of which is slightly narrower than a deflection range within which the sub deflector can deflect light. Exposure is carried out for drawing each portion. A magnitude of deflection u achieved by the main deflector is set to a fixed value permitting the main deflector to deflect an electron beam from the center O of the column to the center of a portion to be exposed. The portion of the pattern is then exposed while a magnitude of deflection v to be achieved by the sub deflector is being varied. When exposure of one portion is completed, the magnitude of deflection u to be achieved by the main deflector is changed to another fixed value permitting the main deflector to deflect the electron beam into the center of a portion to be exposed next. The portion is then exposed with the sub deflector as mentioned above. The data of the exposure pattern is therefore, as described later, composed of main deflector-related deflection data and sub deflector-related deflection data. The main deflector-related deflection data indicates the center of a portion of the exposure pattern. The sub deflector-related deflection data indicates a portion of the exposure pattern.

Figure 3:
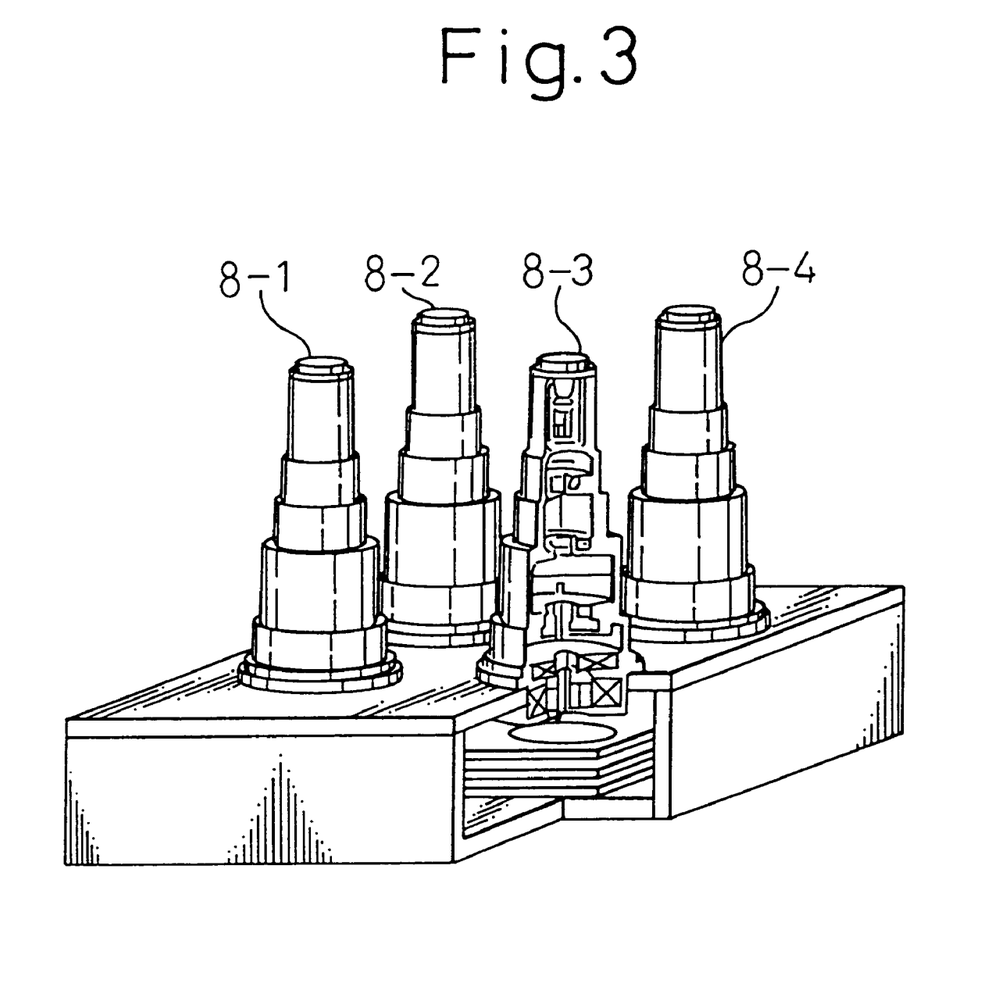
FIG. 3 shows the appearance of a multicolumn electron-beam lithography system.

Electron-beam lithography systems are characterized by a resolution higher than that provided by photolithography systems but have a drawback that the throughput offered by the electron-beam lithography systems is lower than that offered by the photolithography systems. To improve the throughput, a plurality of columns may be included. An electron-beam lithography system having a plurality of columns is referred to as a multicolumn electron-beam lithography system. FIG. 3 is a cutaway showing an example of structures for the multicolumn electron-beam lithography system. The multicolumn electron-beam lithography system may be realized in such a manner that columns each have a stage and expose different wafers. However, in this case, although the multicolumn electron-beam lithography system has a spatial advantage over the employment of a plurality of electron-beam lithography systems arranged mutually adjacently it cannot be said to have a great advantage over it. The multicolumn electron-beam lithography system can therefore be designed in such a manner that the distance between adjoining columns is made so short that the columns can concurrently expose one wafer so as to draw a pattern. In this case, an exposure time required for one wafer can be shortened. The present invention relates to this type of multicolumn electron-beam lithography system.

The electron-beam lithography system employs a high-performance data processing apparatus (computer) for processing abundant data of exposure patterns. For realizing a multicolumn electron-beam lithography system, one data processing apparatus should preferably be able to supply the same pattern data to each column. It is therefore not preferable to install a data processing apparatus for each column.

Figure 4:
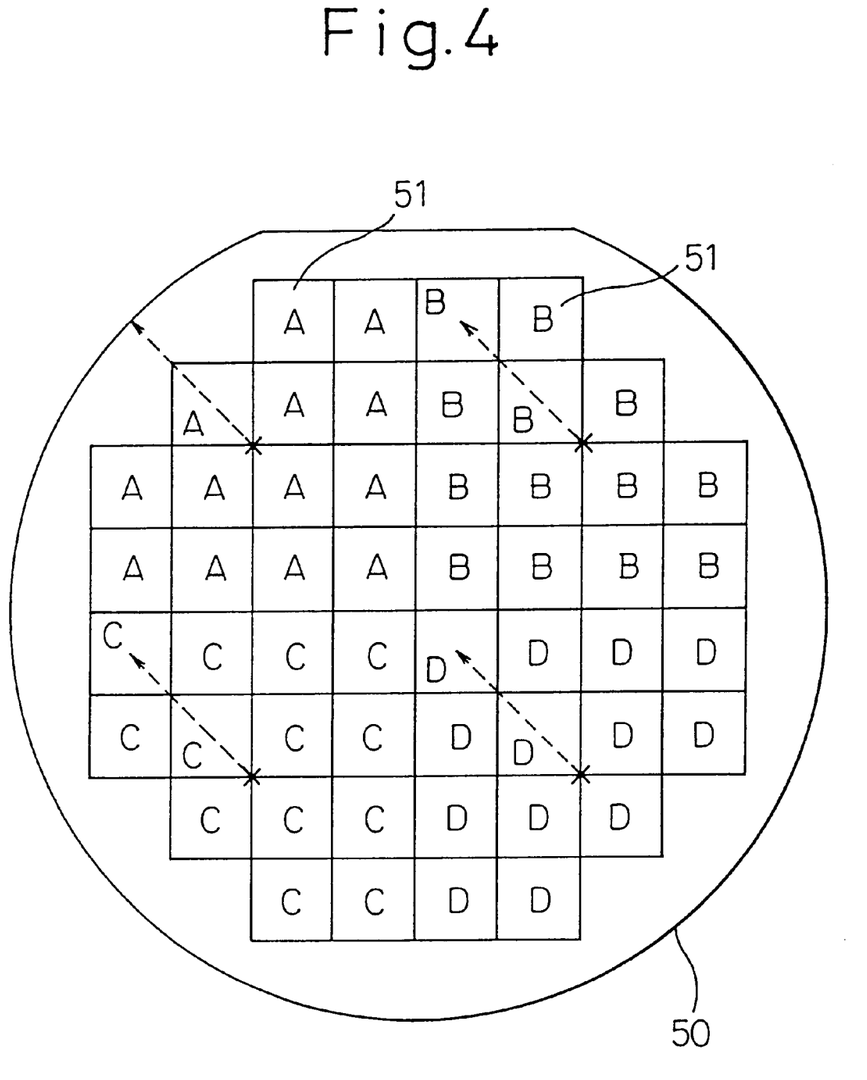
FIG. 4 is an explanatory diagram showing a scene in which a plurality of chips on one wafer are exposed concurrently using a multicolumn electron-beam lithography system.

As shown in FIG. 4, numerous chips are defined in the form of a grid on a wafer. When the columns are used to expose chips concurrently, exposure can be achieved using the same pattern. FIG. 4 relates to a configuration including four columns, wherein the center axes of the columns coincide with positions indicated with x on a wafer 50. Reference numeral 51 denotes chips. Chips A are exposed using the first column, chips B are exposed using the second column, chips C are exposed using the third column, and chips D are exposed using the fourth column. During exposure, the wafer 50 placed on the stage is moved in order to align the center of each chip with the center axis of each column. Specifically, the wafer is moved so that the centers of the columns will follow trajectories indicated with dashed lines having arrows. When the left upper ones of the chips B, C, and D respectively are exposed, there is no chip A to be exposed by the first column, that is, the first column will expose no chip. This description will prove true when a deflection range of the main deflector within which the main deflector can deflect light is larger than one chip. When the deflection range of the main deflector is smaller than one chip, one chip is divided into a plurality of blocks. The stage is moved in order to align the centers of the columns with the centers of blocks. Moreover, for improving efficiency in exposure, while the stage is being moved, the main deflector and sub deflector, and another deflector may be used to correct for a positional change stemming from the movement. Exposure may then be carried out. Hereinafter, for brevity's sake, the deflection range of the main deflector shall be larger than one chip. Exposure shall not be carried out during movement of the stage, and the stage shall be halted during exposure.

As mentioned above, when the columns expose chips concurrently, the distances between the center axes of the columns should preferably match with the arrangement pitches of chips. Assuming that the distances between the center axes thereof match with the arrangement pitches of chips, if the columns expose chips according to the same pattern data, chips exposed by the columns will have the same positional relationship. Consequently, chips are formed on the wafer while arranged as they conventionally are.

Figure 5:
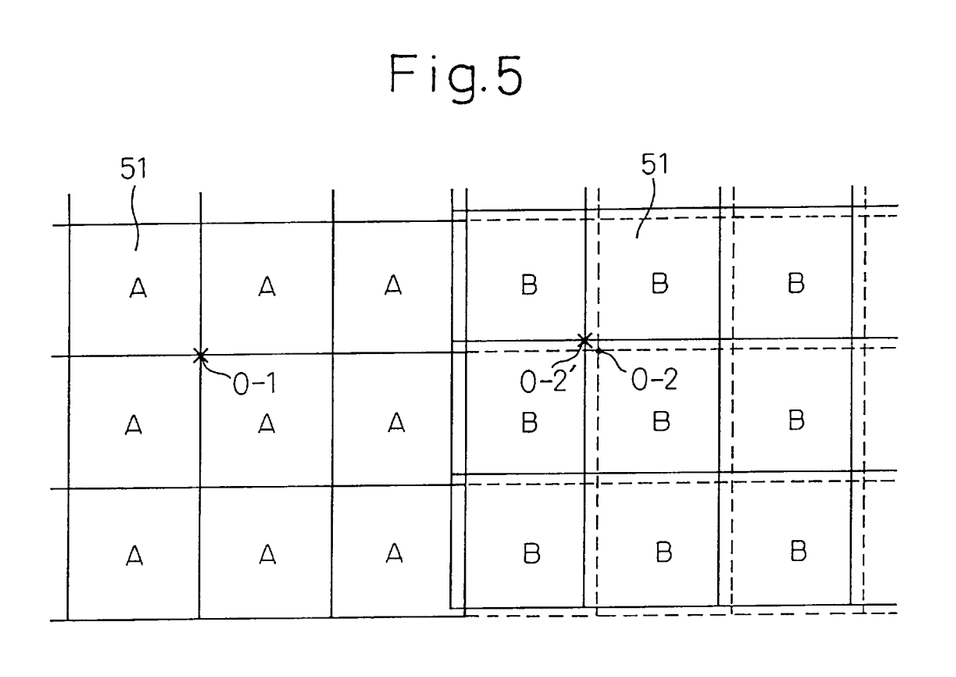
FIG. 5 is an explanatory diagram concerning a trouble occurring when the positions of chips exposed as shown in FIG. 4 are different between columns.

However, it is mechanically very hard to match the distances between the center axes of columns with the arrangement pitches of chips. Occurrence of a mismatch is unavoidable. FIG. 5 is an explanatory diagram concerning a trouble occurring when the distances between the center axes of the columns are mismatched with the arrangement pitches of chips. As shown in FIG. 5, assume that the center axis of the first column is matched with a predetermined position O-1 but the center axis of the second column is mismatched with a predetermined position O-2 but matched with a position O-21'. Due to this mismatch, chips B exposed by the second column are displaced. If the displacement is large, the perimeters of the chips may overlap chips A exposed by the first column. A space is preserved between adjoining chips so that the spaces can be machined to form grooves, along which chips are cut apart, using a dicer or the like. As long as the displacement is smaller than the space, the trouble that adjoining chips overlap will not occur. Nevertheless, the displacement makes the space narrower. This poses a problem in that grooves cannot be formed. If the center axis of a column is mismatched, the space between adjoining chips must be widened. Widening the space between adjoining chips means that the efficiency in utilizing a wafer deteriorates accordingly. This is not preferable.

DISCLOSURE OF THE INVENTION

The present invention attempts to solve the problems described above. An object of the present invention is to realize at a low cost a multicolumn electron-beam lithography method and system capable of achieving high-precision exposure.

To accomplish the above object, a multicolumn electron-beam lithography method and system in accordance with the present invention measures and stores a deviation of an optical axis of each column from a predetermined position in advance. Pattern data is corrected according to the deviation of the optical axis of each column, and columns concurrently drawn the same pattern drawn. In this case, if the whole pattern data is modified for each column, the idea of using common pattern data must be abandoned. An expensive data processing apparatus must be installed for each column. Therefore, the multicolumn electron-beam lithography method and system in accordance with the present embodiment corrects main deflector-oriented data alone.

To be more specific, the multicolumn electron-beam lithography method in accordance with the present invention is such that a plurality of columns is used to concurrently expose one wafer so as to draw a pattern. Each of the plurality of columns includes a main deflector offering a larger magnitude of deflection and a sub deflector offering a smaller magnitude of deflection. The plurality of columns irradiates an electron beam to a sample while deflecting the electron beam according to main deflector-related data and sub deflector-related data. In the multicolumn electron-beam lithography method, deviations of the optical axes of the columns are measured and stored in advance. The main deflector-related data alone is corrected for each column according to the deviation of the optical axis of each column. The columns draw the same pattern concurrently.

Moreover, the multicolumn electron-beam lithography system in accordance with the present invention has a plurality of columns that each include a main deflector offering a larger magnitude of deflection and a sub deflector offering a smaller magnitude of deflection. Moreover, each of the plurality of columns irradiates an electron beam onto a sample while the electron beam is deflected according to main deflector-related data and sub deflector-related data. The plurality of columns draws a pattern concurrently on one wafer. The multicolumn electron-beam lithography system further includes a memory and a correcting means. Deviations of the optical axes of the columns measured in advance are stored in the memory. The correcting means corrects the main deflector-related data alone for each column according to the deviation of the optical axis of each column. The columns concurrently draw the same pattern.

In general, pattern data consists of main deflector-related data and sub deflector-related data. The main deflector-related data specifies data items in association with positions set at intervals of a predetermined distance, and the sub deflector-related data specifies actual pattern portions in association with the data items specified in the main deflector-related data. The main deflector-related data is displaced by the deviation of the optical axis of each column, and thus corrected.

Moreover, for correcting the main deflector-related data, the deviation of the optical axis of each column may be subtracted from the main deflector-related data.

The multicolumn electron-beam lithography method and system in accordance with the present invention allow columns to draw the same pattern concurrently because pattern data is corrected according to the deviation of the optical axis of each column. Moreover, the correction is simple and should be performed on the main deflector-related data alone. A data processing apparatus will not become complex.

BEST MODE FOR CARRYING OUT THE INVENTION

An embodiment of the present invention will be described below. A multicolumn electron-beam lithography system in accordance with the embodiment has a configuration similar to the one shown in FIG. 1. A deflection range of a main deflector within which the main deflector can deflect a beam is larger than one chip. One chip is divided into a plurality of areas. A magnitude of deflection to be achieved by the main deflector is set to a fixed value permitting the main deflector to deflect an electron beam from the center of each column to the center of an area to be exposed. The area is exposed in order to draw a pattern while a magnitude of deflection to be achieved by a sub deflector is being varied.

Figure 6:
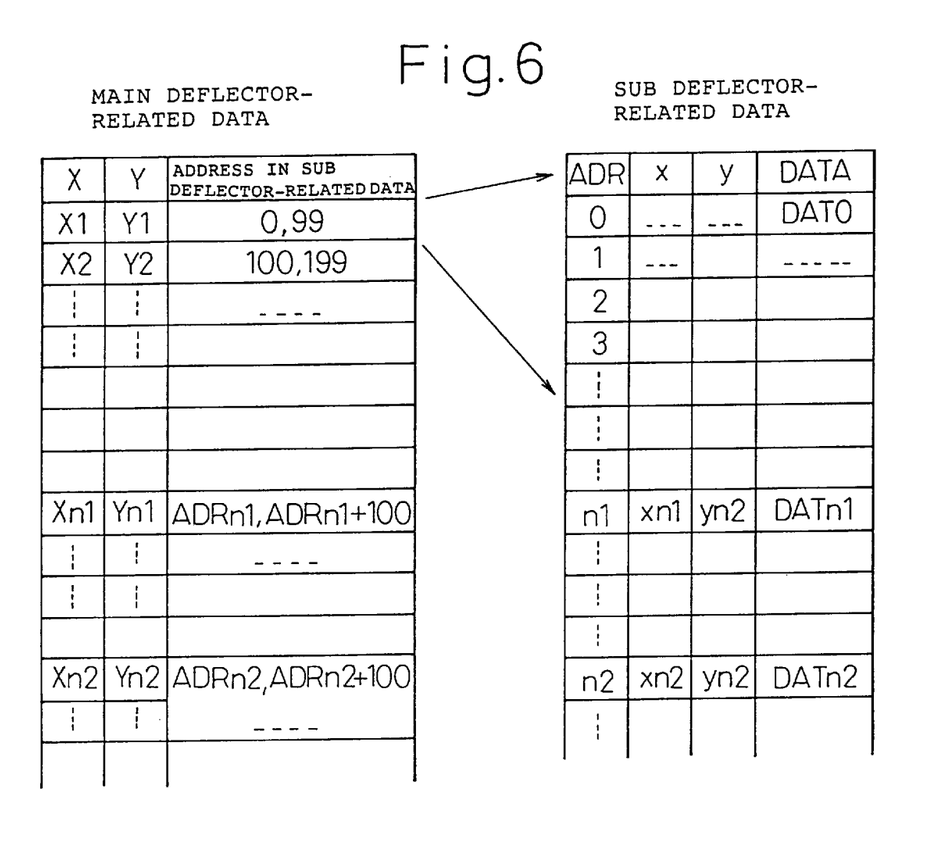
FIG. 6 shows the data structures of main deflector-related data and sub deflector-related data in accordance with an embodiment.

FIG. 6 shows a basic format of pattern data generally employed in the foregoing electron-beam lithography system. The embodiment of the present invention also adopts this format of pattern data. The pattern data consists of, as illustrated, main deflector-related data and sub deflector-related data. The main deflector-related data consists of X and Y coordinates indicating the center of each area, and information indicating addresses at which sub deflector-related data, used to draw a pattern portion in each area, is stored. The sub deflector-related data consists of x and y coordinates indicating a pattern portion to be drawn in each area and data DATA representing the pattern. As apparent from the data structures, the sub deflector-related data is much more complex than the main deflector-related data, and the amount of sub deflector-related data is larger than that of main deflector-related data. For exposure, the leading data item of the main deflector-related data is read, and the magnitude of deflection to be achieved by the main deflector is set to the X and Y coordinates indicating the center of each area. After a settlement time required to complete deflection has elapsed, data items specified in the sub deflector-related data are read successively from addresses specified in the main deflector-related data. Exposure is thus carried out. When drawing a pattern portion in one area is completed, the next data item specified in the main deflector-related data is read, and the same processing is carried out. This procedure is repeated until all data items have been treated.

Figure 7:
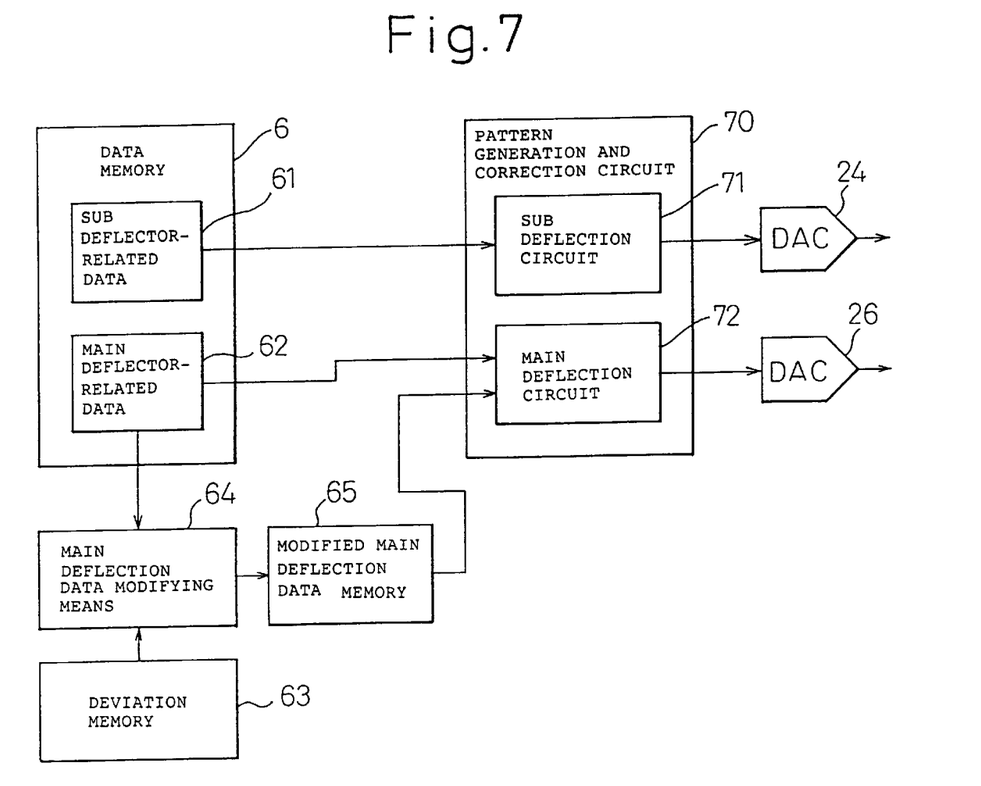
FIG. 7 is a block diagram showing the configuration of a multicolumn electron-beam lithography system in accordance with the embodiment in terms of the relationship of control.

FIG. 7 is a block diagram showing the configuration of the multicolumn electron-beam lithography system in accordance with the embodiment of the present invention in terms of the relationship of control. As illustrated, sub deflector-related data 61 and main deflector-related data 62 are stored mutually independently in the data memory 6. A pattern generation and correction circuit 70 having the capabilities of the pattern generation circuit 19 and pattern correction circuit 20 has a sub deflection circuit 71 and a main deflection circuit 72. The sub deflector-related data and main deflector-related data are processed mutually independently. Control data used to control the sub deflector and main deflector and generated by the pattern generation and correction circuit 70 is output to D/A conversion circuits 24 and 26. These components are fundamentally identical to those of a conventional multicolumn electron-beam lithography system. The data memory 6 is used in common among a plurality of columns. The sub deflection circuit 71 included in the pattern generation and correction circuit 70 is also used in common among the plurality of columns. However, the main deflection circuit 72 is provided for each column.

In the present embodiment, a deviation memory 63, a main deflection data modifying means 64, a modified main deflection data memory 65 are included in columns other than a reference column. Deviations of the optical axes of the columns are measured in advance and stored in the deviation memory 63. The deviations of the axes of the columns are deviations from the reference column. The deviations are calculated by measuring the positions of marks on stages. The main deflection data modifying means 64 subtracts a deviation stored in the deviation memory 63 from X and Y coordinates specified in the main deflector-related data 62 shown in FIG. 6. The result of subtraction is stored in the modified main deflection data memory 65. Addresses in sub deflector-related data specified in the main deflector-related data 62 are associated with modified X and Y coordinates existing in the modified main deflection data memory 65. The address and X and Y coordinates are read simultaneously and supplied to the main deflection circuit 72 in the pattern generation and correction circuit 70. The reference column exposes chips according to the sub deflector-related data 61 and main deflector-related data 62 existent in the data memory 6. The other columns expose chips according to the sub deflector-related data 61 in the data memory 6, the addresses in the sub deflector-related data specified in the main deflector-related data 61 therein, and the modified X and Y coordinates in the modified main deflection data memory 65. Chips exposed by the columns have a desired positional relationship. It will therefore not occur that the distance between adjoining chips is made narrow or that chips overlap.

As shown in FIG. 6, the amount of the main deflector-related data 62 is smaller than that of the sub deflector-related data 61. It is easy to subtract a deviation from x and Y coordinates so as to produce modified main deflection data. The storage capacity of the modified main deflection data memory is therefore small. As mentioned above, even when X and Y coordinates specified in the main deflector-related data 62 are modified, the cost of the system and a processing time required by the system will hardly increase.

Figure 8:
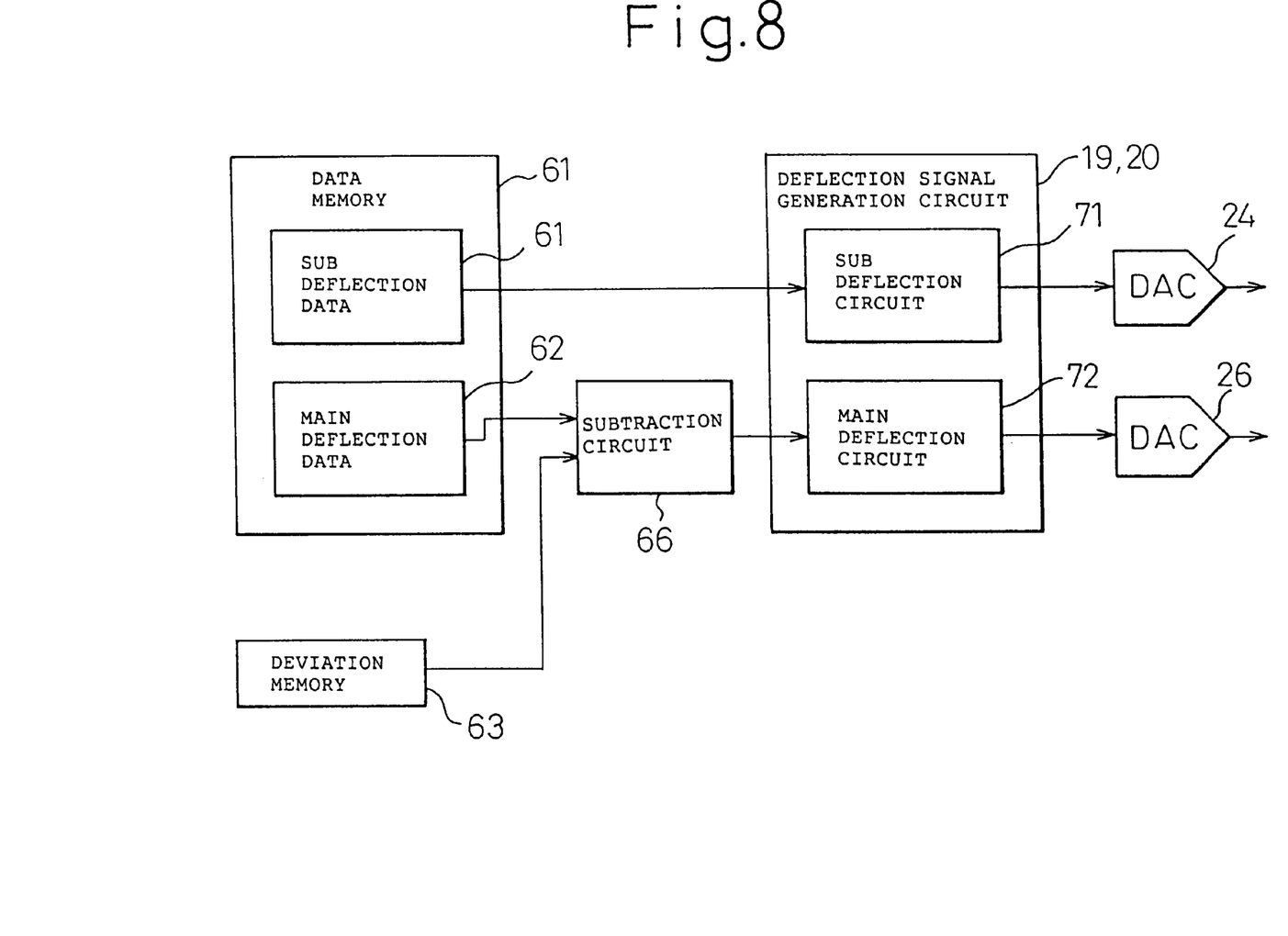
FIG. 8 is a block diagram showing the configuration of a variant of multicolumn electron-beam lithography systems in accordance with the present invention, indicating a relationship of control.

The embodiment of the present invention has been described so far. The present invention permits variations. For example, FIG. 8 shows a configuration in which the deviation memory 63 and a subtraction circuit 66 are included in columns other than a reference column. The subtraction circuit 66 subtracts a value stored in the deviation memory 63 from the main deflector-related data 62 read for exposure, and outputs resultant data to the main deflection circuit 72. In this variant, it is unnecessary to modify X and Y coordinates specified in the main deflector-related data 62.

As described so far, according to the present invention, since a plurality of columns is included, the throughput offered by a system can be improved. Moreover, since part of a control unit is used in common among the columns, the configuration of the system can be simplified accordingly. It is unnecessary to use a high-performance CPU to form the control unit. Consequently, the cost of the system can be reduced.

INDUSTRIAL APPLICABILITY

According to the present invention, an electron-beam lithography system offering an improved throughput can be realized at a low cost using a plurality of columns. Consequently, very fine machining can be achieved with a high throughput ensured. A high degree of integration of circuit elements constituting a semiconductor device can be attained at an appropriate cost.

What is claimed is:

1. An electron-beam lithography method, according to which each of a plurality of columns has a main deflector offering a large magnitude of deflection and a sub deflector offering a small magnitude of deflection and irradiates an electron beam onto a sample while deflecting it according to main deflector-related data and sub deflector-related data is used to concurrently draw a pattern on one wafer, said electron-beam lithography method characterized in that:

deviations of the optical axes of said columns are measured and stored in advance;

said main deflector-related data alone is corrected for each column according to the deviation of the optical axis of each column; and said columns draw the same pattern concurrently.

2. An electron-beam lithography method according to claim 1, wherein said sub deflector-related data specifies data items in association with data items that are specified in said main deflector-related data in relation to positions set at intervals of a predetermined distance, and wherein said correction is achieved by displacing said main deflector-related data by the deviation of the optical axis of each column.

3. An electron-beam lithography method according to claim 1, wherein said correction is achieved by subtracting the deviation of the optical axis of each column from said main deflector-related data.

4. An electron-beam lithography system having a plurality of columns that each include a main deflector offering a large magnitude of deflection and a sub deflector offering a small magnitude of deflection and irradiates an electron beam onto a sample while deflecting it according to main deflector-related data and sub deflector-related data, said plurality of columns concurrently drawing a pattern on one wafer, said electron-beam lithography system comprising:

a deviation memory in which deviations of the optical axes of said columns measured in advance are stored; and a correcting means for correcting said main deflector-related data alone for each column according to the deviation of the optical axis of each column, wherein said columns draw the same pattern concurrently.

5. An electron-beam lithography system according to claim 4, wherein said sub deflector-related data specifies data items in association with data items that are specified in said sub deflector-related data in relation to positions set at intervals of a predetermined distance, wherein said correcting means includes a main deflection data modifying means for displacing said main deflector-related data by the deviation of the optical axis of each column, and a modified main deflection data memory in which modified main deflection data is stored.

6. An electron-beam lithography system according to claim 4, wherein said correcting means includes a subtraction circuit for subtracting the deviation of the optical axis of each column from said main deflector-related data.

* * * * *